United States Patent [19]

Wheatley

[11] 4,379,272
[45] Apr. 5, 1983

[54] AGC CIRCUIT WITH LEVEL-COMPENSATING INPUT

[75] Inventor: Mark A. Wheatley, Maidenhead, England

[73] Assignee: Racal-Dana Instruments Limited, Berkshire, England

[21] Appl. No.: 211,272

[22] Filed: Nov. 28, 1980

[30] Foreign Application Priority Data

Dec. 15, 1979 [GB] United Kingdom ............... 7943279

[51] Int. Cl.³ .......................... H03C 1/06; H03G 3/20
[52] U.S. Cl. .................................... 332/38; 328/175; 330/144; 332/9 R; 455/116
[58] Field of Search ..................... 332/9 R, 9 T, 31 R, 332/31 T, 37 R, 37 D, 38; 375/24, 41; 455/108, 109, 116; 330/278, 279, 282, 284, 86, 144, 145; 328/175; 307/264

[56] References Cited

U.S. PATENT DOCUMENTS

| | | | |
|---|---|---|---|
| 3,460,041 | 8/1969 | Orwin et al. | 332/37 R X |
| 3,662,390 | 5/1972 | Elliott | 332/38 |
| 3,668,533 | 6/1972 | Fish et al. | 328/175 X |

Primary Examiner—Siegfried H. Grimm
Attorney, Agent, or Firm—Leydig, Voit, Osann, Mayer & Holt, Ltd.

[57] ABSTRACT

An automatic gain control (AGC) circuit arrangement is disclosed as including an AGC loop responsive to an input signal and operative to maintain an output signal at a desired mean level represented by a reference signal applied in the loop and also subjected to amplitude modulation by an AF signal. The circuit arrangement includes modulators outside the loop for changing the level of the input signal by amounts corresponding respectively to changes in level represented by changes in the AF signal and by changes in the reference signal. Therefore, the level of the input signal as received by the AGC loop is at least approximately at the right value and its gain is held substantially constant even when the level of the required output signal for a given input signal changes. Therefore, variations of bandwidth resulting from gain variations are avoided.

3 Claims, 1 Drawing Figure

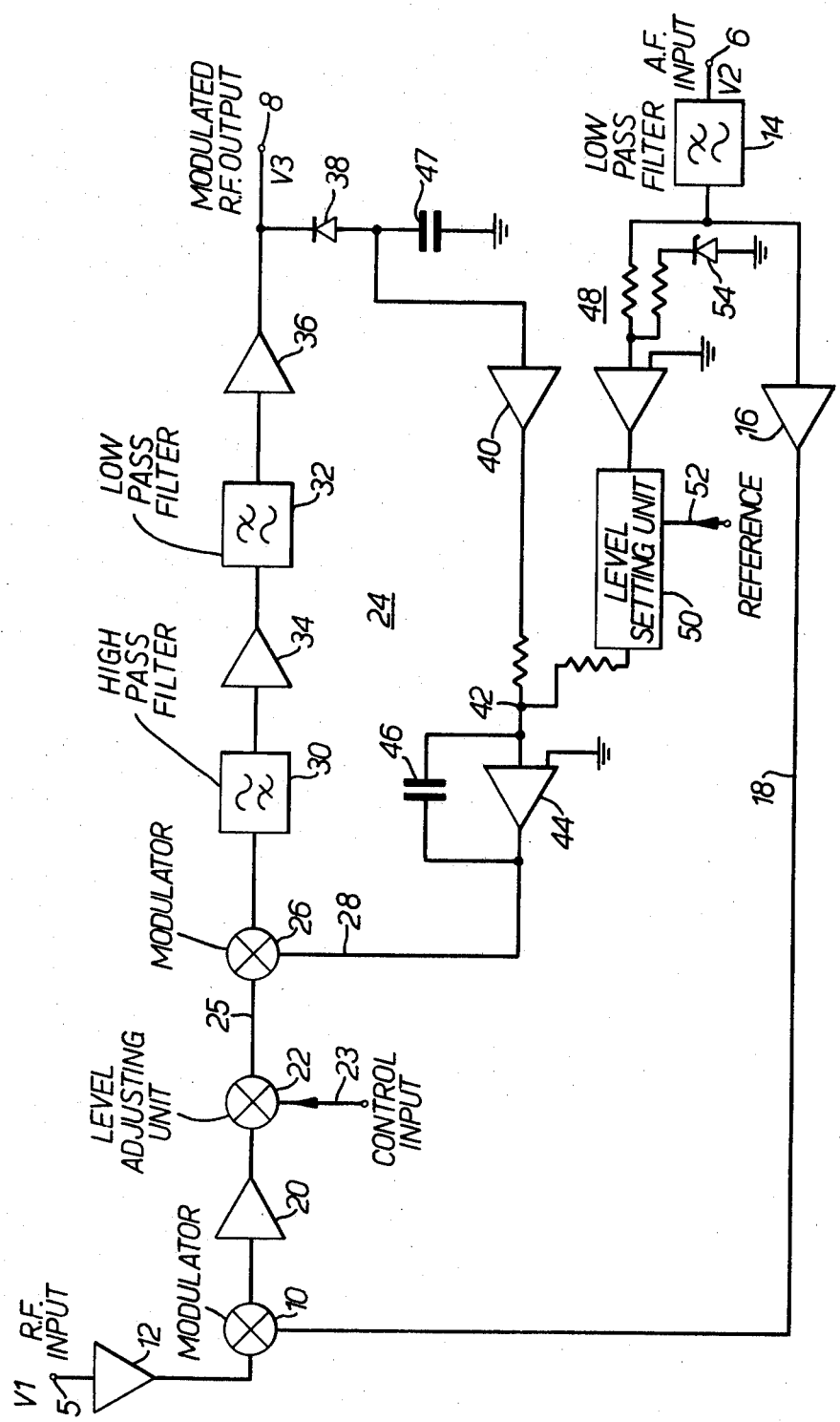

AGC CIRCUIT WITH LEVEL-COMPENSATING INPUT

BACKGROUND OF THE INVENTION

The invention relates to electrical circuit arrangements. One example of an electrical circuit arrangement to which the invention relates is an automatic gain control (AGC) circuit arrangement.

Various AGC circuit arrangements are known. However, a problem which can arise with known AGC circuit arrangements is that their bandwidth varies with gain and thus with the level of output signal for a given input. This variation of bandwidth can give rise to instability.

BRIEF SUMMARY OF THE INVENTION

According to the invention, there is provided in an electrical circuit arrangement for automatic gain control including an AGC loop responsive to an input signal and operative to maintain an output signal at a desired mean level represented by a reference signal applied in the loop, level changing means outside the loop and connected to change the level of the input signal by an amount corresponding to changes in level represented by changes in the reference signal, so that the level of the input signal as received by the AGC loop is at least approximately at the right value.

DESCRIPTION OF THE DRAWING

An AGC circuit arrangement embodying the invention will now be described, by way of example only, with reference to the accompanying circuit diagram of the circuit arrangement.

DESCRIPTION OF PREFERRED EMBODIMENTS

The circuit arrangement has an input terminal 5 at which a radio frequency (RF) input signal V1 is received, an input terminal 6 at which an audio frequency (AF) signal is received and an output terminal 8 at which is produced an output signal V3 which is an RF signal modulated by the AF signal V2. The circuit arrangement includes means for amplitude-modulating the RF input signal V1 by the AF signal V2 and for maintaining the mean level of the output signal V3 at a desired value.

As shown, the RF input V1 is applied to one input of an amplitude modulator 10 through a buffer amplifier 12. The second input of the modulator 10 receives the AF signal V2 via a low pass filter 14 for limiting the AF bandwidth, an amplifier 16 and a line 18. The modulated output of the modulator 10 is then fed through an amplifier 20 to one input of a level-adjusting unit 22, which could be in the form of an attenuator adjustable by means of a control signal on a line 23.

The output of the level adjusting unit 22 is then fed to an AGC loop 24 on a line 25.

The loop 24 comprises a modulator 26 to one input of which the output of the unit 22 is fed on the line 25 and to the other input of which a control signal is fed on a line 28. The output of the modulator 26 is fed through high and low pass filters 30 and 32 between which is interposed an amplifier 34. The output of the filter 32 is fed through a further amplifier 36 to the output terminal 8.

A diode 38 detects the output of the amplifier 36 (that is, the signal V3) and feeds the detected signal through an amplifier 40 to a point 42 at the input of an amplifier 44 which has a capacitor 46 connected across it to make it act as an integrator. The diode 38 acts in conjunction with a smoothing capacitor 47.

The AF signal V2 is passed via the filter 14 and an amplifier 48 to a level setting unit 50. The unit 50 receives a reference signal on a line 52 by which the desired mean level of the output V3 is set and the reference unit 50 therefore produces a resultant output which is fed to the terminal 42 at the input of the integrator amplifier 44.

The output of the integrator amplifier 44 provides the control signal for the modulator 26 on the line 28.

The signals on lines 23 and 52 are arranged to be adjusted together so that when the signal on line 52 is adjusted to produce a specific change in level of the signal V3, the signal on line 23 is adjusted simultaneously by an amount necessary to produce the same specific change in the signal V3.

In operation the modulator 26 responds to the control signal received on line 28, which in turn is dependent on the mean difference (if any) between the two signals applied to its input terminal 42, by adjusting its output so as to reduce this difference towards zero.

Because the amplitude-modulating signal V2 is applied not only to the AGC loop 24 but also to the amplitude modulator 10, via the line 18, the input to the modulator 26 on the line 25 will already have been adjusted so as at least approximately to take into account the effect on the mean level of the output signal V3 of changes in the level of the amplitude-modulating signal.

In addition, the level adjustment produced by the unit 22, in response to its control signal on line 23 (which, as explained, corresponds with the level represented by the reference signal on line 52) ensures that the input signal on line 23 to the modulator 26 has been adjusted at least approximately to the level of the reference signal on line 52.

Therefore, the AGC loop 24 only has to correct for errors which may develop between the actual and desired mean levels of the output signal V3. If the desired mean level of the signal V3 changes, because of a change in the level of the modulating signal V2 and/or because of a change in the reference signal on line 52, the AGC loop 24 does not itself have to make the necessary adjustment. This is because the modulator 10 and the vernier 22 themselves alter the level of the input to the AGC loop 24 to at least approximately the right value.

Therefore, the AGC loop 24 is always operating at substantially the same level and its gain and bandwidth level remain substantially constant.

The amplifier 48 is controlled by a zener diode 54 to provide a reference for the loop and to set its gain.

Because the modulator 10 and the level adjusting device 22 are only required to set the level to approximately the required value, they do not need to be high accuracy devices.

The circuit arrangement may be used with advantage for pulse modulation because both modulators 10 and 26 can be switched off between the modulating pulses thus providing a more accurate output signal.

What is claimed is:

1. In an electrical circuit arrangement for automatic gain control including an AGC loop responsive to an input signal and operative to maintain an output signal at a desired mean level represented by a reference signal applied in the loop, level changing means outside the loop and connected to change the level of the input signal by an amount corresponding to changes in level represented by changes in the reference signal, so that the level of the input signal as received by the AGC loop is at least approximately at the right value.

2. A circuit arrangement according to claim 1, including means for applying a signal dependent on an amplitude-modulating signal to the AGC loop as an additional reference signal, and in which the level changing means includes means for amplitude-modulating the input signal with the amplitude-modulating signal whereby the mean level of the input signal to the AGC loop is at least approximately at the value represented by the algebraic sum of the first-mentioned and the additional reference signals.

3. An electrical circuit arrangement, comprising first amplitude-modulating means to amplitude-modulate an input signal in dependence on an amplitude-modulating signal, level changing means to adjust the level of the input signal in dependence on the value of a level control signal, and an AGC loop having second amplitude-modulating means connected to receive the input signal after it has been amplitude-modulated by the first amplitude-modulating means and has had its level adjusted by the level adjusting means, the AGC loop including means operative to compare the level of the output of the second amplitude-modulating means with the algebraic sum of the level of the amplitude-modulating signal and a reference signal corresponding in value to the value of the level control signal whereby to produce an error signal dependent on the difference if any between the signals compared, and means applying the error signal to the second amplitude-modulating means to adjust the output of the latter in a direction tending to reduce the error signal to zero, whereby the mean level of the output of the second amplitude-modulating means has a value dependent on the levels of the reference signal and the amplitude-modulating signal, and the gain of the AGC loop is substantially constant and independent of the mean level of the output signal.

* * * * *